United States Patent [19]

Shintani et al.

[11] Patent Number: 5,422,174
[45] Date of Patent: Jun. 6, 1995

[54] ELECTROMAGNETIC WAVE SHIELDING BUILDING MATERIAL

[75] Inventors: Takamasa Shintani, Yamatokooriyama; Masatake Nakamura, Tokyo, both of Japan

[73] Assignee: Sekisui Chemical Co. Ltd., Osaka, Japan

[21] Appl. No.: 106,290

[22] Filed: Aug. 13, 1993

[30] Foreign Application Priority Data

Aug. 18, 1992 [JP] Japan ................. 4-219404

[51] Int. Cl.$^6$ ................. B32B 9/00
[52] U.S. Cl. ................. 428/320.2; 428/297; 428/688; 428/76; 174/137 R; 174/137 A; 174/158 R
[58] Field of Search .......... 174/137 R, 137 A, 158 R; 428/688, 320.2, 297

[56] References Cited

FOREIGN PATENT DOCUMENTS 57-100953  6/1982  Japan ................. C04B 13/100
9014321  11/1990  WIPO .

OTHER PUBLICATIONS

Chemical Abstracts, vol. 105, No. 16, 20 Oct. 1986, Columbus, Ohio, US; Abstract No. 138795f, "abstract" & Database WPI Week 9235, Derwent Publications Ltd., London GB; AN 86-147060 "abstract" & JP-A-61-076 359 (Asahi Engineering Co, Ltd.).

Carbon, vol. 29, No. 3, 1991, Elmsford, N.Y., US, pp. 287-295 M. Inagaki "Research and Development on Carbon/Ceramic composites in Japan" p. 287, Left col., Paragraph 1; p. 290, Left col. Paragraph 1-right col., Paragraph 2, FIG. 9.

Chemical Abstracts, vol. 111, No. 20, 13 Nov. 1989, Columbus, Ohio, US; Abstract No. 179802y, "abstract" & JP-A-01 131 042 (Fuji Electrochemical Co. Ltd.) 23 May 1989.

Chemical Abstracts, vol. 110, No. 10, 15 May 1989, Columbus, Ohio, US; Abstract No. 178538j, "abstract" & JP-A-63 276 537 (Kajima Corp.) 14 Nov. 1988.

*Primary Examiner*—Patrick J. Ryan
*Assistant Examiner*—Kam Lee
*Attorney, Agent, or Firm*—Deveau, Colton & Marquis

[57] ABSTRACT

An electromagnetic wave shielding building material is disclosed, the building material comprising an electrically conductive concrete which has electromagnetic wave shielding properties and comprises a hydraulic inorganic material and carbon fibers of 0.6-3% by weight. It is possible to easily produce the building material having good electromagnetic wave shielding functions at low cost.

2 Claims, 3 Drawing Sheets

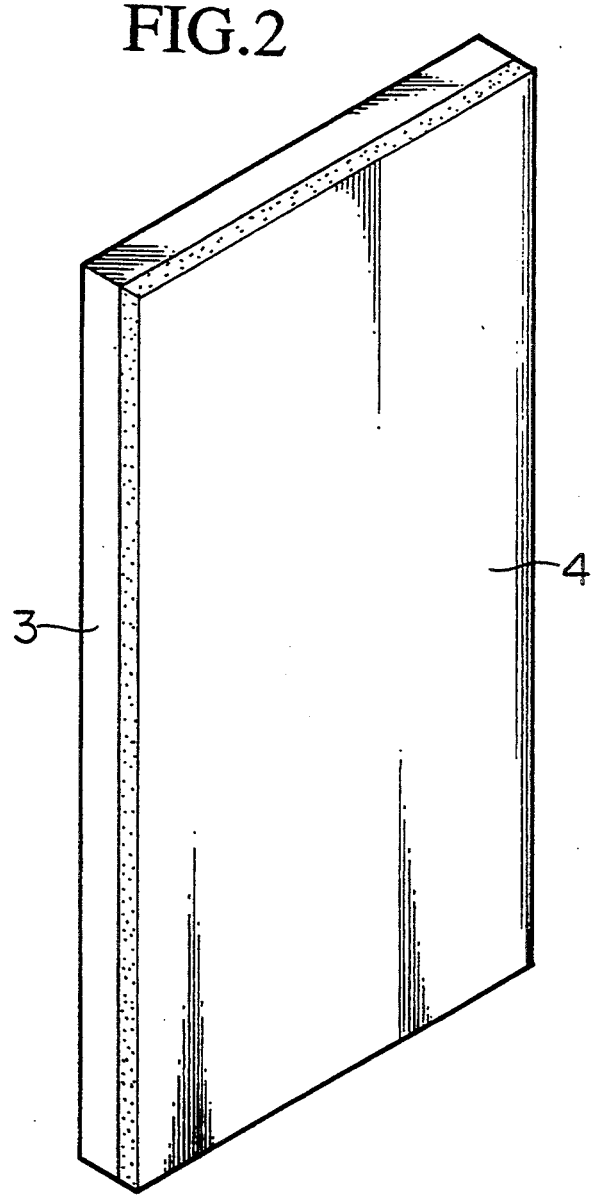

FIG.3

| DIRECTION OF POLARIZATION | DISTANCE FROM TRANSMISSION ANTENNA (m) | DISTANCE FROM RECEIVER (m) | FREQUENCY (MHz) | SHIELDING RATIO dB | |
|---|---|---|---|---|---|
| | | | | CONDUCTIVE CONCRETE 5mm (THICKNESS) | CONDUCTIVE CONCRETE 10mm (THICKNESS) |
| HORIZONTAL | 3 | 0.1 | 30 | MORE THAN 27 | MORE THAN 27 |
| | | | 80 | MORE THAN 26 | MORE THAN 26 |
| | | | 100 | MORE THAN 50 | MORE THAN 50 |
| | | | 200 | MORE THAN 49 | MORE THAN 49 |
| | | | 300 | MORE THAN 51 | MORE THAN 51 |
| | | | 400 | MORE THAN 44 | MORE THAN 44 |
| | | | 500 | MORE THAN 47 | MORE THAN 47 |
| | | | 600 | MORE THAN 49 | MORE THAN 49 |
| | | | 700 | MORE THAN 50 | MORE THAN 50 |
| | | | 800 | MORE THAN 52 | MORE THAN 52 |
| | | | 900 | MORE THAN 48 | MORE THAN 48 |
| | | | 1000 | | |
| VERTICAL | 3 | 0.3 | 30 | MORE THAN 32 | MORE THAN 32 |
| | | | 80 | MORE THAN 31 | MORE THAN 31 |
| | | | 100 | MORE THAN 48 | MORE THAN 48 |
| | | | 200 | MORE THAN 40 | MORE THAN 40 |
| | | | 300 | MORE THAN 47 | MORE THAN 47 |
| | | | 400 | 40.6 | MORE THAN 54 |
| | | | 500 | 37.7 | MORE THAN 54 |
| | | | 600 | 40.1 | MORE THAN 49 |
| | | | 700 | MORE THAN 45 | MORE THAN 45 |
| | | | 800 | MORE THAN 51 | MORE THAN 51 |
| | | | 900 | MORE THAN 48 | MORE THAN 48 |

ELECTROMAGNETIC WAVE SHIELDING BUILDING MATERIAL

BACKGROUND OF THE INVENTION

1. Industrial Field of the Invention

The present invention relates to a building material having an electromagnetic wave shielding function which may be used, for example, to avoid the influence of electromagnetic waves from the outside of a building.

2. Related Art

Recently, the need for a building material having an electromagnetic wave shielding function has increased, in order to prevent the influence of unnecessary electric waves such as electromagnetic waves from the outside, to assure the security, and to effectively use electric waves.

In order to produce an electromagnetic wave shield for a building, it is necessary to cover portions of the building, e.g., the floor, the wall, the ceiling thereof and the like, with an electromagnetic wave shielding material and to electrically unify these portions. Therefore, under the present circumstances, an electromagnetic wave shield is generally constructed by placing a shielding material such as a copper foil inside the portions of the building, or example, inside the external concrete wall of the building.

However, there are problems in that such a conventional method requires a long time to complete the finishing work and the like. Since the execution of work for applying the shielding material such as a copper foil requires a highly skilled worker, the conventional method is costly.

The present invention was developed in view of the above-described problems. Therefore, an object of the present invention is to provide a building material having the electromagnetic wave shielding function, which does not require adjustment with the finishing work or the like, and can be easily produced at low cost.

SUMMARY OF THE INVENTION

In order to achieve the above-described object, the electromagnetic wave shielding building material of the present invention comprises an electrically conductive concrete which has an electromagnetic wave shielding property and comprises a hydraulic inorganic material and carbon fibers of 0.6–3% by weight.

Any material having the characteristic of self-hardening when mixed with water can be used as the hydraulic inorganic material. For example, a non-blended cement, e.g., a normal Portland cement, a special Portland cement, an alumina cement, or a Roman cement; a special cement, e.g., an acidproof cement, a refractory cement, a water glass cement, a magnesia cement or the like; or gypsum, lime or the like, can be used. The above-listed material are generally used alone. However, more than one of the listed materials may be used in combination.

Carbon fiber of a PAN-type, pitch-type, or rayon-type, or a carbon whisker or the like may be used as the carbon fiber as the material to give electrical conductivity to the building material. Such a type of carbon fiber also may be used alone, or in combination.

A layer of the conductive concrete is formed by the finish coat construction method, the pneumatic applied construction method or the like. The thickness of the conductive concrete layer which is formed on a precast concrete panel (PC panel) or a plaster board is preferably about 5–10 mm.

Since the electromagnetic wave shielding building material as described above comprises an electrically conductive concrete containing carbon fibers of 0.6–3% by weight, the building material has good electromagnetic wave shielding properties and does not require the adjustment with the finishing work when a building is constructed.

Preferably, the carbon fibers have an average length of 4–30 mm and an average diameter of 1–20 $\mu$m.

When the average length of the carbon fibers used for the electromagnetic wave shielding building material is small, a large quantity of carbon fibers are required in order to assure necessary conductivity of the electromagnetic wave shielding building material. Addition of a large quantity of carbon fibers results in a lowering of work efficiency in production of the electrically conductive hydraulic hardening products and a lowering of strength of the hardening products. On the other hand, when the average length of the carbon fibers is large, dispersibility of the carbon fibers is lowered. Consequently, the electrical conductivity of the hardening products tends not to be uniform. Therefore, the average length of the carbon fibers is preferably 4–30 mm, and more preferably 6–25 mm. A carbon fiber having good conductivity requires a diameter of about 1–20 $\mu$m, and preferably of 5–15 $\mu$m.

In the electromagnetic wave shielding building material as described above, since the carbon fibers have an average length of 4–30 mm and an average diameter of 1–20 $\mu$m, it is possible to assure necessary conductivity for the electromagnetic wave shielding building material without addition of a large quantity of carbon fibers, to increase work efficiency in production of the electrically conductive hydraulic hardening products, and to prevent a lowering of strength of the hardening products. Furthermore, dispersibility of the carbon fibers is good, thereby the electrical conductivity of the hardening products is uniform.

Preferably, the electrically conductive concrete has an electromagnetic wave shielding property of 30–50 dB.

In such an electromagnetic wave shielding building material, since the electrically conductive concrete in the building material has an electromagnetic wave shielding property of 30–50 dB, it is possible to construct a building having an excellent electromagnetic wave shielding function by using the electromagnetic wave shielding building material.

Preferably, the electromagnetic wave shielding building material comprises a precast concrete panel or a plaster board, and an electrically conductive concrete layer formed thereon.

Accordingly, it is possible not only to maintain the appearance of the building but also to sufficiently assure the mechanical strength thereof, and to give an electromagnetic wave shielding function to the building by forming the electrically conductive concrete layer thereon.

Preferably, the building material comprises an electrically conductive light-weight cellular concrete. In this structure, the quantity of carbon fibers to be mixed is preferably about 0.6–3% by weight in order to sufficiently assure the property of electromagnetic wave shielding and the mechanical strength.

According to the electromagnetic wave shielding building material comprising a single layer of an electrically conductive light-weight cellular concrete, it is possible not only to make the building material light, but also to prevent shrinkage cracks, warping or the like caused by drying, differences in expansion coefficients or the like, of a building material with a double-layer construction.

BRIEF DESCRIPTION OF THE DRAWINGS

FIG. 2 is a perspective view showing an electromagnetic wave shielding building material which comprises a plaster board and an electrically conductive concrete layer formed thereon, according to the second embodiment of the present invention.

FIG. 3 is a table showing results of tests with respect to electromagnetic wave shielding characteristics of the produced building material.

PREFERRED EMBODIMENT OF THE INVENTION

Figure 1:
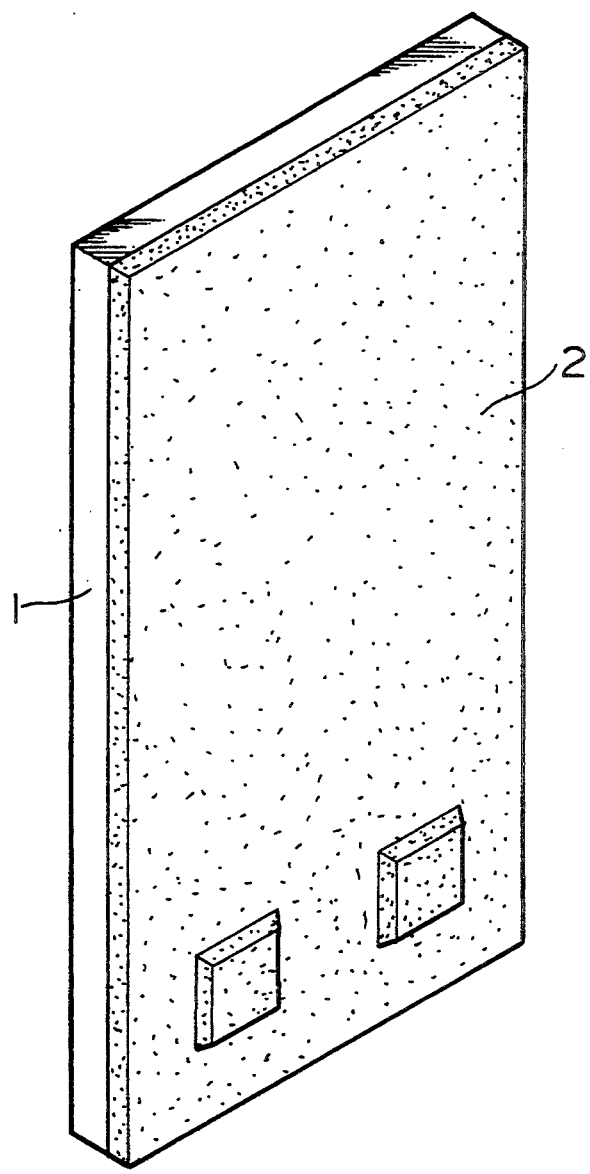
FIG. 1 is a perspective view showing an electromagnetic wave shielding building material which comprises a PC panel (a precast concrete panel) and an electrically conductive concrete layer formed thereon, according to the first embodiment of the present invention.

Hereinafter, an embodiment of the electromagnetic wave shielding building material of the present invention will be explained in detail.

FIG. 1 is a perspective view showing an electromagnetic wave shielding building material according to the first embodiment of the present invention. The electromagnetic wave shielding building material comprises a PC panel (a precast concrete panel) and an electrically conductive concrete layer formed thereon.

First, an electrically conductive concrete material was produced as follows.

3 parts by weight of a pitch-type carbon fiber which has a density of 1.7 g/cm$^3$, an average diameter of 13 μm, and an average length of 15 mm, was added with 100 parts by weight of Normal Portland cement having a specific gravity of 3.17, 60 parts by weight of calcium carbonate having a specific gravity of 2.72, and 20 parts by weight of silica sand (mean particle size: 0.6–0.8 mm). The mixture was mixed and dispersed for 6 minutes by using a blender (Trade Name: Eirich Counter-Current Intensive Mixers). 42 parts by weight of water was added with 100 parts by weight of this mixture, and these were then mixed. Consequently, an electrically conductive concrete compound was obtained. Thereafter, a PC panel (a precast concrete panel) 1 having a width of 3.3 m, a height of 3.5 m, and a thickness of 90 mm was prepared, as shown in FIG. 1. An electrically conductive concrete layer 2 having a thickness of about 10 mm was formed by applying the electrically conductive concrete compound by the above-described process on the back surface of the PC panel 1 by using a finish coat construction method. The conductive concrete layer 2 formed on the PC panel 1 was then cured for 3 days.

The electromagnetic wave shielding building material produced by the above-described process was tested. According to FIG. 3 showing the results of the test, it may be understood that the produced building material has good electromagnetic wave shielding properties.

FIG. 2 is a perspective view showing an electromagnetic wave shielding building material which comprises a plaster board 3 and an electrically conductive concrete layer 4 formed thereon, according to the second embodiment of the present invention.

Such an electrically conductive concrete material was produced in a manner similar to that of the first embodiment, as follows.

3 parts by weight of a pitch-type carbon fiber which has a density of 1.7 g/cm$^3$, an average diameter of 13 μm, and an average length of 15 mm, was added with 100 parts by weight of Normal Portland cement having a specific gravity of 3.17, 60 parts by weight of calcium carbonate having a specific gravity of 2.72, and 20 parts by weight of silica sand (mean particle size: 0.6–0.8 mm). The mixture was mixed and dispersed for 6 minutes by using a blender (Trade Name: Eirich Counter-Current Intensive Mixers). 42 parts by weight of water was added with 100 parts by weight of this mixture, and these were then mixed. Consequently, an electrically conductive concrete compound was obtained. Thereafter, a plaster board (a precast concrete panel) 3 having a width of 0.9 m, a height of 1.8 m, and a thickness of 12 mm was prepared, as shown in FIG. 2. An electrically conductive concrete layer 4 having a thickness of about 5 mm was formed by applying the electrically conductive concrete compound by the above-described process on the back surface of the plaster board 3 by using a pneumatic applied construction method. The conductive concrete layer 4 formed on the plaster board 3 was then cured for 3 days.

The electromagnetic wave shielding building material produced by the process was tested. According to FIG. 3 showing the results of the test, it may be understood that the produced building material has good electromagnetic wave shielding properties.

In the above-described first and second embodiments, since the electromagnetic wave shielding building material comprises a PC panel or a plaster board, and an electrically conductive concrete layer formed thereon, it is possible not only to maintain the appearance of the building but also to sufficiently assure the mechanical strength thereof, and to give an electromagnetic wave shielding function to the building by forming the electrically conductive concrete layer thereon.

The electromagnetic wave shielding building material may be formed by using an electrically conductive lightweight cellular concrete, e.g., an electrically conductive ALC (Autoclaved Light-Weight Concrete). The building material may also be formed by only a single layer.

Such an electrically conductive concrete material was produced as follows.

3 parts by weight of a pitch-type carbon fiber which has a density of 1.7 g/cm$^3$, an average diameter of 13 μm, and an average length of 15 mm, was added with 100 parts by weight of Normal Portland cement having a specific gravity of 3.17, 80 parts by weight of silica sand having an average particle size of 10 μm, and 2 parts by weight of aluminum powder. The mixture was mixed and dispersed for 6 minutes by using a blender (Trade Name: Eirich Counter-Current Intensive Mixers). 120 parts by weight of water was added with 100 parts by weight of this mixture, and these were then mixed. The electrically conductive concrete compound obtained by such a process was molded and an autoclave curing was carried out for 10 hours. Consequently, ALC panels having a width of 0.6 m, a height of 3.5 m, and thicknesses of 75, 100, 125, and 150 mm were formed.

The electromagnetic wave shielding building material produced by the process was tested. According to the results of the test, it was found that the produced building material had a good electromagnetic wave shielding properties similar to those of the first and second embodiments.

When the electromagnetic wave shielding building material is formed by a single layer of an electrically conductive light-weight cellular concrete, it is possible not only to lighten the building material but also to prevent shrinkage cracks, a warping or the like caused by drying, difference of expansion coefficients or the like of a building material with two-layer construction.

As described above, since the electromagnetic wave shielding building material of the present invention comprises an electrically conductive concrete containing carbon fibers of 0.6–3% by weight, it is possible to obtain a building material having good electromagnetic wave shielding properties which does not require adjustment with the finishing works during building construction.

In the electromagnetic wave shielding building material of the present invention, when the carbon fibers have an average length of 4–30 mm and an average diameter of 1–20 μm, it is possible to assure necessary conductivity for the electromagnetic wave shielding building material without addition of a large quantity of carbon fibers, to increase work efficiency in production of the electrically conductive hydraulic hardening products, and to prevent a lowering of strength of the hardening products. Furthermore, it is possible to improve dispersibility of the carbon fibers, thereby making the electrical conductivity of the hardening products uniform.

In the electromagnetic wave shielding building material of the present invention, when the electrically conductive concrete in the building material has an electromagnetic wave shielding property of 30–50 dB, it is possible to construct a building having an excellent electromagnetic wave shielding function by using the electromagnetic wave shielding building material.

Furthermore, when the electromagnetic wave shielding building material of the present invention comprises a precast concrete panel or a plaster board, and an electrically conductive concrete layer formed thereon, it is possible not only to maintain the appearance of the building but also to sufficiently assure the mechanical strength thereof, and to give an electromagnetic wave shielding function to the building by forming the electrically conductive concrete layer thereon.

When the electromagnetic wave shielding building material of the present invention comprises a single layer of an electrically conductive light-weight cellular concrete, it is possible not only to make the building material light but also to prevent shrinkage cracks, warping or the like caused by drying, differences in expansion coefficients or the like of a building material having a double-layer construction.

What is claimed is:

1. An electromagnetic wave shielding building material comprising:
    (a) a precast concrete panel; and
    (b) an electrically conductive concrete layer formed on the precast concrete panel, said concrete layer containing a hydraulic inorganic material and carbon fibers in an amount of from 0.6 to 3% by weight of said hydraulic inorganic material, wherein said carbon fibers have an average length of 4–30 mm and an average diameter of 1–20 μm, and wherein said electrically conductive concrete layer has an electromagnetic wave shielding property of 30–50 dB.

2. An electromagnetic wave shielding building material comprising:
    (a) a plaster board; and
    (b) an electrically conductive concrete layer formed on the plaster board, said concrete layer containing a hydraulic inorganic material and carbon fibers in an amount of from 0.6 to 3% by weight of said hydraulic inorganic material, wherein said carbon fibers have an average length of 4–30 mm and an average diameter of 1–20 μm, and wherein said electrically conductive concrete layer has an electromagnetic wave shielding property of 30–50 dB.

* * * * *